(12) United States Patent
Tatsumi

(10) Patent No.: US 7,843,214 B2
(45) Date of Patent: Nov. 30, 2010

(54) SEMICONDUCTOR INTEGRATED CIRCUIT DEVICE HAVING STANDARD CELL INCLUDING RESISTANCE ELEMENT

(75) Inventor: Kyoka Tatsumi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 16 days.

(21) Appl. No.: 12/320,187

(22) Filed: Jan. 21, 2009

(65) Prior Publication Data

US 2009/0195282 A1  Aug. 6, 2009

(30) Foreign Application Priority Data

Feb. 6, 2008  (JP)  ............................. 2008-026545

(51) Int. Cl.
*G06F 7/38* (2006.01)
*H03K 19/173* (2006.01)

(52) U.S. Cl. .................. 326/37; 326/38; 326/101; 326/102

(58) Field of Classification Search .................. None
See application file for complete search history.

(56) References Cited

U.S. PATENT DOCUMENTS

2008/0012617 A1* 1/2008 Boerstler et al. ............ 327/175
2008/0191751 A1* 8/2008 Oh ............................... 327/114

* cited by examiner

*Primary Examiner*—Anh Q Tran
(74) *Attorney, Agent, or Firm*—McGinn IP Law Group, PLLC

(57) ABSTRACT

A standard cell includes an input terminal, an output terminal, first and second inverters coupled in series between the input and output terminals, the first inverter including a first transistor of a first conductivity type and a second transistor of a second conductivity type, the first transistor being coupled between a first power source terminal and a first node, and the second transistor being coupled between a second node and a second power source terminal, and a plurality of resistance elements which are used to provide a conductivity path between the first and second nodes, in order to adjust a duty ratio of a signal which passes the standard cell.

10 Claims, 18 Drawing Sheets

SEMICONDUCTOR INTEGRATED CIRCUIT DEVICE HAVING STANDARD CELL INCLUDING RESISTANCE ELEMENT

BACKGROUND OF THE INVENTION

1. Field of the Invention

The present invention relates to a semiconductor integrated circuit device, more particularly to a semiconductor integrated circuit device having a circuit used for delay adjustments.

2. Description of Related Art

When designing a DDR (Double Data Rate) system or the like, both rising and falling edges of signals are used. In case of such a DDR system, however, when the signal waveform duty ratio is deviated from 50%, it is becoming difficult more and more to keep the setup time and hold time, for example, in the input side flip-flop process or the like. In case of a system used for fast clock transmissions, if the signal waveform duty ratio is deviated from 50%, then the eye aperture rate falls, thereby the number of errors that might occur at the receiving side comes to increase. Consequently, such a system is usually required to have a function for adjusting the output signal duty ratio so as to be fixed at 50%.

The patent document 1 discloses a semiconductor integrated circuit device, which includes an output buffer circuit. The output buffer circuit includes a pull-up circuit and a pull-down circuit. The pull-up circuit supplies a charging current to an output terminal to pull up the potential level and the pull-down circuit pulls out the discharging current from the output terminal to pull down the potential level. In case of this semiconductor integrated circuit device, at least one or more resistors are connected to each another serially either between an output end and an output terminal of the pull-up circuit or between an output end and an output terminal of the pull-down circuit. In each of those resistors, both ends thereof are short-circuited or opened. In such a semiconductor integrated circuit device, the signal waveform duty ratio can be adjusted by adjusting each of the rising and falling waveforms independently even when the driving performance is unbalanced between rising and falling edges of signals, thereby the digital signal waveform duty ratio is unbalanced.

The patent document 2 discloses a layout for quickening the operation of a standard cell in a specific transient direction without changing its height. This layout can lower the threshold voltage of either the pMOS transistor or the nMOS transistor among the transistors of the cell, thereby quickening the operation of the standard cell in a specific transient direction without changing its shape. For example, in order to lower the threshold voltage of the nMOS transistor, the layout can change the amount of impurity ions to be implanted in the channel region of the nMOS transistor.

The patent document 2 also discloses a similar layout that can quicken the operation of an object standard cell only in one transient direction by changing and matching the well boundaries at both ends of the cell only with respect to the transistors in the cell while keeping the height of the standard cell. If it is impossible to change the threshold voltage only in the pMOS or NMOS transistor, for example, even when the threshold voltages of both NMOS and pMOS transistors are lowered up to their limits, then the layout enables the operation of the standard cell to be quickened in a specific transient direction while keeping the height, although the width of the cell comes to increase by several to several tens of percentage.

[Patent document 1] Japanese Patent Application Laid Open No. Hei5(1993)-102826

[Patent document 2] Japanese Patent Application Laid Open No. 2003-330984

SUMMARY

As described above, the patent document 1 discloses a circuit having at least one or more resistors that are connected to each another serially and disposed at least either between an output end and an output terminal of a pull-up circuit or between an output end and an output terminal of a pull-down circuit and used to adjust the signal waveform duty ratio. However, the patent document 1 does not describe anything about any case of a layout in which such a circuit is employed for the standard cell.

On the other hand, the patent document 2 also describes a layout of a cell to be realized by changing the amount of impurity ions to be implanted into a channel region or by changing the well boundaries with respect to the cell. In case of such a semiconductor integrated circuit device, when making a design change for a digital signal waveform duty ratio adjustment, it is required to change the transistor structure, which is the ground or the like, in the first half of the design process. Consequently, it becomes impossible to reduce the number of designing processes of the semiconductor integrated circuit device, thereby the designing cost might increase.

According to one aspect of the present invention, a semiconductor integrated circuit device includes a first power supply wiring which receives a first voltage supply, a second power supply wiring, which receives a second voltage supply and is laid in parallel to the first power supply wiring, a plurality of standard cells provided in a rectangular area having two sides that are a part of the first supply wiring and a part of the second power supply wiring, an at least one transistor resistance area provided in the rectangular area. Each of the standard cell includes a first well of a first conductivity provided along the first power supply wiring, a second well of a second conductivity provided along the second power supply wiring and between the first first-conductivity well and the second power supply wiring, a first-conductivity MOS transistor provided in the second well, and a second-conductivity MOS transistor provided in the first well. The transistor resistance area includes a third well of the first or second conductivity, having a rectangular shape including two sides that are a portion of the first power supply wiring and a portion of the second power supply wiring, and a plurality of MOS transistor resistances each having a conductivity opposite to that of the third well. The plurality of MOS transistor resistances are arranged so that a number of MOS transistor resistances among the plurality of MOS transistor resistances are connected to each serially, in parallel, or in a combination of serial and parallel connections between the first-conductivity MOS transistor and the second-conductivity MOS transistor.

According to the exemplary aspect of the present invention, because the semiconductor integrated circuit device is configured so that a transistor resistance area is laid out beforehand and transistor resistances can be wired in the area, there is no need to change the ground such as the transistor structure, etc. when adjusting the signal waveform duty ratio, thereby the number of designing processes can be reduced.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Figure 1:
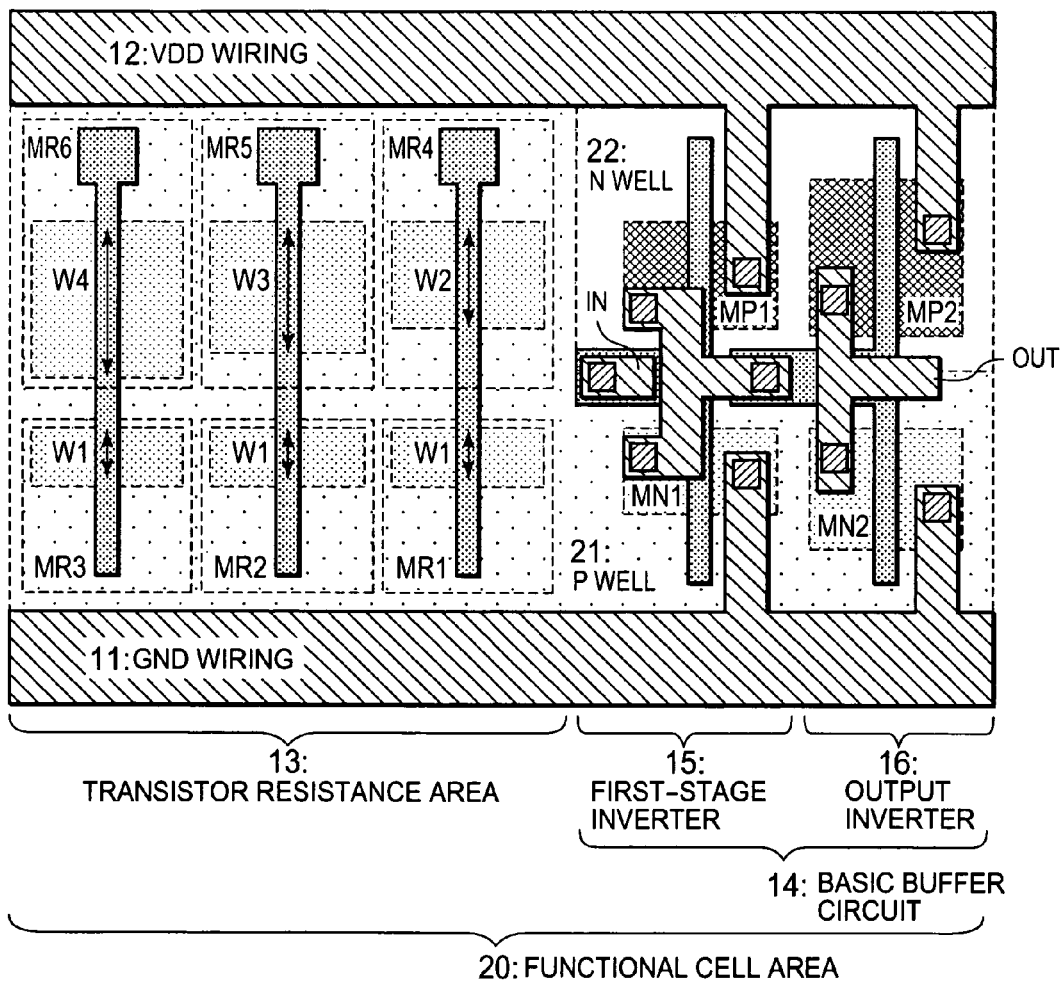
FIG. 1 is a basic layout of a semiconductor integrated circuit device in a first exemplary embodiment of the present invention.
Figure 1:
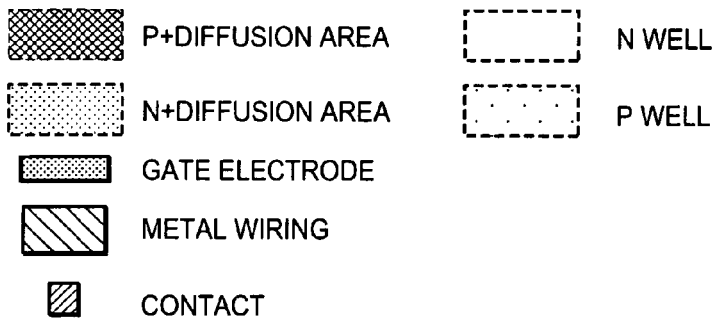

In an exemplary embodiment of the present invention, the semiconductor integrated circuit device includes a GND wiring, a VDD wiring laid in parallel to the GND wiring; a plurality of standard cells provided in each of approximately rectangular areas having two sides that are part of the GND wiring and part of the VDD wiring respectively, and at least one transistor resistance area. The semiconductor integrated circuit device is configured as follows. Each of the standard cells includes a first N well provided at a fixed height between a first P well provided at a fixed height along the GND wiring and another P well provided along the VDD wiring; an NMOS transistor provided in the first P well; and a PMOS transistor provided in the first N well. The transistor resistance area includes an approximately rectangular second P well having two sides that are part of the GND wiring and part of the VDD wiring; and a plurality of NMOS transistor resistances provided in the second P well. And a given number of transistor resistances among the plurality of MOS transistor resistances are connected to each another serially, in parallel, or in a combination of both serial and parallel connections between the drains of the PMOS transistor and the NMOS transistor. N (P) well may be cited as well of first (second) conductivity type. Further, N (P) well may be written as second (first) conductivity type.

The semiconductor integrated circuit device may also be configured as follows. The transistor resistance area includes an approximately rectangular second N well having two sides that are part of the GND and part of the VDD wiring and a plurality of PMOS transistor resistances provided in the second N well. And a given number of transistor resistances among the plurality of PMOS transistor resistances are connected to each another serially, in parallel, or in a combination of both serial and parallel connections between the drains of the PMOS transistor and the NMOS transistor.

In the semiconductor integrated circuit device of the present invention, it is also possible to use a contact and/or wiring option to connect the given number of transistor resistances to each another.

In each standard cell of the semiconductor integrated circuit device of the present invention, it is also possible to connect the source of the NMOS transistor to the GND wiring and the source of the PMOS transistor to the VDD wiring and connect the gates of the PMOS and NMOS transistors in common to each other to form an input end and use the drain of the PMOS or NMOS transistor as an output end.

In the semiconductor integrated circuit device of the present invention, the gates of the plurality of NMOS transistor resistances may be connected to the VDD wiring respectively.

In the semiconductor integrated circuit device of the present invention, the gates of the plurality of PMOS transistor resistances may be connected to the GND wiring respectively.

In the semiconductor integrated circuit device of the present invention, the plurality of NMOS transistor resistances may include some types of transistor resistances that are different in size from each another.

In the semiconductor integrated circuit device of the present invention, the plurality of PMOS transistor resistances may include some types of transistor resistances that are different in size from each other.

In the semiconductor integrated circuit device of the present invention, it is also possible to dispose a standard cell and a transistor resistance area adjacently to make the first and second P wells common or the first and second N wells common.

In the semiconductor integrated circuit device of the present invention, the wiring area related to the mask option may include wirings disposed at an integer multiple of the minimum pitch of the wiring rule and enable a dummy wiring to be laid in a blank region between the mask option related wirings.

When designing the standard cells, the designing for various types of cells should be made on the same conditions as far as possible to suppress the designing cost. This is why the semiconductor integrated circuit device of the present invention has aligned those cells in height and implanted the same amount of impurity ions into their wells that are aligned in height as far as possible, thereby making the designing easier and assuring items to be designed in uniform quality. And in case of a circuit that requires delay adjustments, the ground of the transistor such as the structure is kept as is. And the connections of the transistor resistances are changed as needed with use of a contact and/or metal wiring mask option. Such a configuration could change delay adjustment related designs in the latter half of the designing process that uses the mask option, thereby the number of designing processes can be reduced.

In other words, in case of the semiconductor integrated circuit device as described above, it is possible to make fine adjustments of the delay or balance just by adding/deleting contact and/or wiring patterns without affecting the chip wiring. Consequently, timing adjustment can be made within a short turnaround time (TAT).

The semiconductor integrated circuit device of the present invention has a wiring pattern buried in a transistor resistance area beforehand and used to change the transistor resistances for adjusting rising/falling delays of signals and change resistance values for adjusting such delays. This is why the semiconductor integrated circuit device can be configured without changing any of the cell size, transistor shape, and input terminal capacity before and after the rising/falling balance adjustment, so the semiconductor integrated circuit device can prevent the increase of the cell size and the input terminal capacity, as well as the falling of the yield, the increase of the wiring repairs, etc.

Hereunder, there will be described an exemplary embodiment the semiconductor integrated circuit device of the present invention in detail with reference to the accompanying drawings.

First Exemplary Embodiment

FIG. 1 shows a basic layout of a semiconductor integrated circuit device in this first exemplary embodiment of the present invention. In FIG. 1, the semiconductor integrated circuit device includes a rectangular functional cell area 20 between a GND wiring 11 and a VDD wiring 12 laid in parallel to the GND wiring 11. The functional cell area 20 includes a transistor resistance area 13 and a basic buffer circuit 14 that are adjacent to each other.

The transistor resistance area 13 includes an approximately rectangular P well 21 having two sides that are part of the GND wiring 11 and part of the VDD wiring 12, as well as a plurality of NMOS transistor resistances MR1 to MR6 provided in the P well 21. In FIG. 1, the NMOS transistor resistances MR1 to MR6 mean transistors made of transistors respectively in an N+ diffusion area in a transistor disposition area. Here, the gate of a transistor in the transistor resistance area 13 has a fixed length L and an interval. The N+ diffusion layer (area) may be structured in a rectangular shape so that each pair of upper and lower transistor resistances, for example, MR1 and MR4, are aligned at both right and left ends. Furthermore, those upper and lower transistor resistances may also be structured so as to take many types of resistance values according to the size W to be varied freely.

It is premised here that the NMOS transistor resistances MR1 to MR6 are W1, W1, W1, W2, W3, and W4 in width and their transistor resistance values, when those MR1 to MR6 are connected to the VDD wiring 12 respectively, are 50KΩ, 50KΩ, 50KΩ, 30KΩ, 20KΩ and 10K ΩK. And the gates of the NMOS transistor resistances MR1 and MR4 are connected in common to each other, the gates of the NMOS transistor resistances MR2 and MR5 are connected in common to each other, and the gates of the NMOS transistor resistances MR3 and MR6 are connected in common to each other. The NMOS transistor resistances MR1 to MR6 do not have any connection paths except for their gates.

In the transistor resistance area 13 configured as described above, the transistor resistances are disposed equally in length and in interval to keep the yield favorably. And transistors are formed also in dead spaces of the diffusion layer so as to eliminate unevenness in disposition density form the diffusion layer, thereby realizing a masking pattern that can prevent the elements therein from being varied in quality. Furthermore, in order to suppress the increase of the cell size, a plurality of same conductivity transistors are disposed at both upper and lower regions with respect to one gate in the P well 21 formed by bending a well in the transistor resistance area 13. The resistance component is thus buried efficiently in the masking pattern.

It is also possible to form three or more transistor resistances in the vertical direction with respect to one gate in the transistor resistance area 13 as far as the cell size can be extended more in the height direction.

The basic buffer circuit 14 means a standard cell disposed in a rectangular area between the GND wiring 11 and the VDD wiring 12 laid in parallel to the GND wiring 11. The circuit 14 includes a first-stage inverter 15 and an output inverter 16 connected to the first-stage inverter 15. The basic buffer circuit 14 also includes an N well 22 provided at a fixed height between a P well 21 provided at a fixed height along the GND wiring and another P well 21 provided along the VDD wiring; NMOS transistors MN1 and MN2 provided in the P wells 21; and PMOS transistors MP1 and MP2 provided in the N well 22. The P well disposed in the transistor resistance area 13 and the P well disposed in the basic buffer circuit 14 are common.

The first-stage inverter 15 includes an NMOS transistor MN1 and a PMOS transistor MP1. The NMOS transistor MN1 has a source connected to the GND wiring 11 and a drain connected in common to the drain of the PMOS transistor MP1 to form an output end of the first-stage inverter 15. The NMOS transistor MN1 also has a gate connected in common to the gate of the PMOS transistor MP1 to form an input end IN of the first-stage inverter 15. The PMOS transistor MP1 has a source connected to the VDD wiring 12.

The output inverter 16 includes an NMOS transistor MN2 and a PMOS transistor MP2. The NMOS transistor MN 2 has a source connected to the GND wiring 11 and a drain connected in common to the gate of the PMOS transistor MP2 to form an output end OUT of the output inverter 16. The NMOS transistor MN2 also has a gate connected in common to the gate of the PMOS transistor MP2 and connected to the output end of the first step inverter 15. The PMOS transistor MP2 has a source connected to the VDD wiring 12.

The basic buffer circuit 14 configured as described above can thus output the input terminal IN signal waveform duty ratio to the output terminal OUT as is.

Next, there will be described a configuration example when a delay adjustment is made by connecting the NMOS transistor resistances MR1 to MR6 to each other with use of a contact and/or metal wiring mask option. In the following example, the structure (ground) of the transistors in the transistor resistance area 13 is kept as is and a contact and/or metal wiring mask option is used to change the connection among the object transistor resistances. And as needed, the wiring between the drains of the NMOS transistor MN1 and the PMOS transistor MP1 is changed. In the following layouts, the same reference numerals will be used for the same items as those in FIG. 1, avoiding redundant description. The P well 21 and the N well 22 are omitted in those layouts to simplify the drawings.

Figure 2:
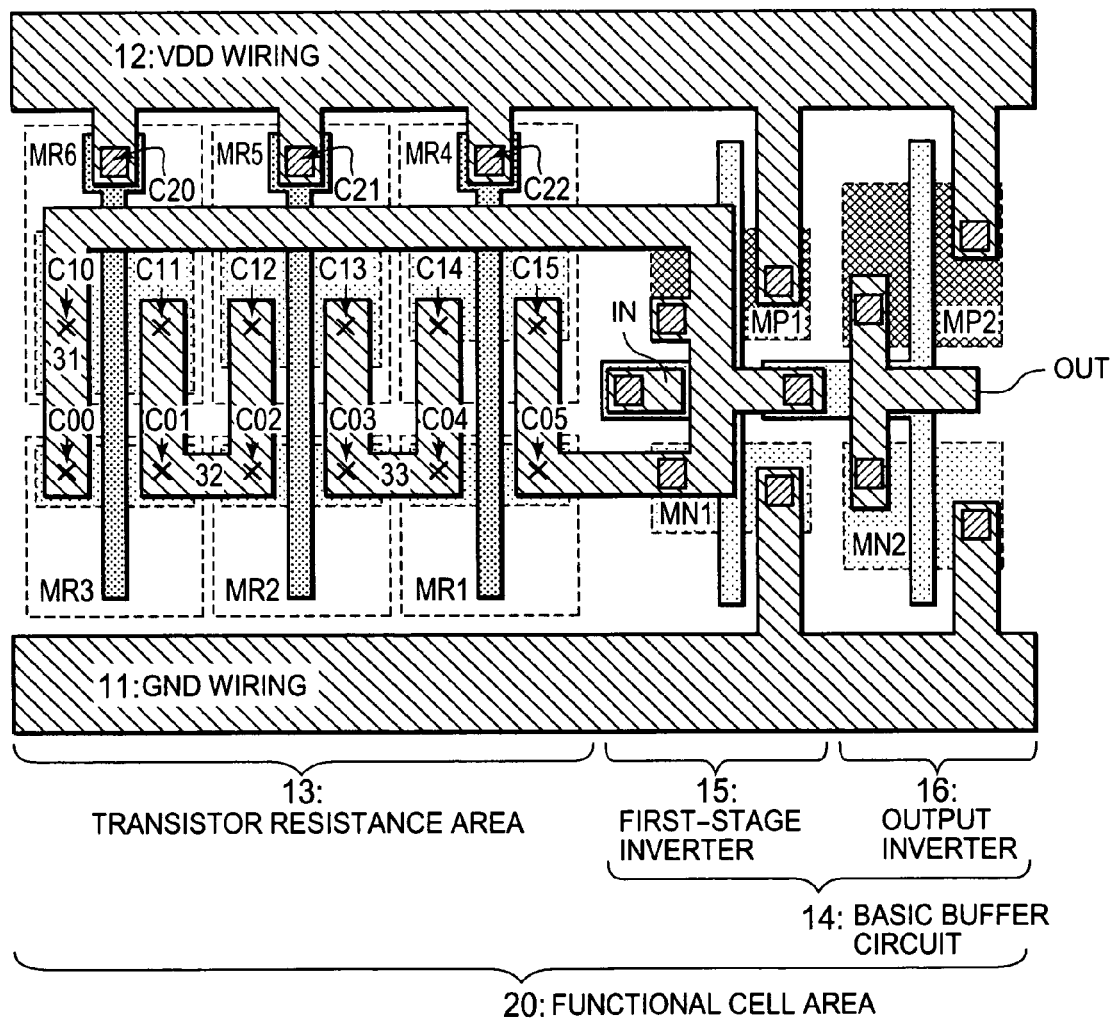
FIG. 2 is a first example of the layout of the semiconductor integrated circuit device in the first exemplary embodiment of the present invention.
Figure 2:
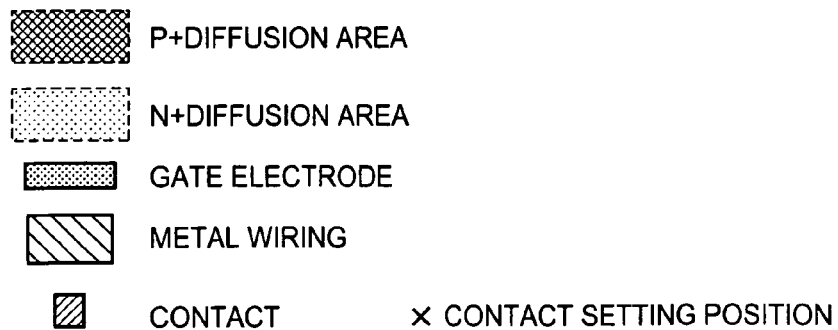

FIG. 2 shows a first example of the layout of the semiconductor integrated circuit device in the first exemplary embodiment of the present invention. In FIG. 2, the gates of the NMOS transistor resistances MR1 and MR4 are connected to the VDD wiring 12 through a contact C22. The gates of the NMOS transistor resistances MR2 and MR5 are connected to the VDD wiring 12 through a contact C21. The gates of the NMOS transistor resistances MR3 and MR6 are connected to the VDD wiring 12 through a contact C20. In the following description, it is premised that all the gates of the NMOS transistor resistances in the transistor resistance area 13 are connected in such a way.

A wiring 31 is laid to the setting position of a contact C00 through which the wiring 31 is connected to one end of the NMOS transistor resistance MR3, the setting position of a contact C10 through which the wiring 31 is connected to one end of the NMOS transistor resistance MR6, and connected to the drains of the NMOS transistor MN1 and the PMOS transistor MP1, the gates of the NMOS transistor MN2 and the PMOS transistor MP2, laid to the setting position of a contact C05 through which the wiring 31 is connected to one end of the NMOS transistor resistances MR1, and the setting position of a contact C15 through which the wiring 31 is connected to one end of the NMOS transistor resistances MR4 respectively. A wiring 32 is laid to contacts C01, C11, C02, and C12 through which the wiring 32 is connected to the other end of the NMOS transistor resistance MR3, the other end of the NMOS transistor resistance MR6, one end of the NMOS transistor resistance MR2, and one end of the NMOS transistor resistance MR5 respectively. A wiring 33 is laid to the setting positions of contacts C03, C13, C04, and C14 through which the wiring 33 is connected to the other end of the NMOS transistor resistance MR2, the other end of the NMOS transistor resistance MR5, the other end of the NMOS transistor resistance MR1, and the other end of the NMOS transistor resistance MR4 respectively. Here, there is provided none of the contacts C00 to C05 and C10 to C15.

In the transistor resistance area 13, such metal wirings as the wirings 31, 32, and 33 are laid at the minimum wiring interval so as to prevent other extra wirings from being laid among them by an automatic wiring tool.

Figure 3:
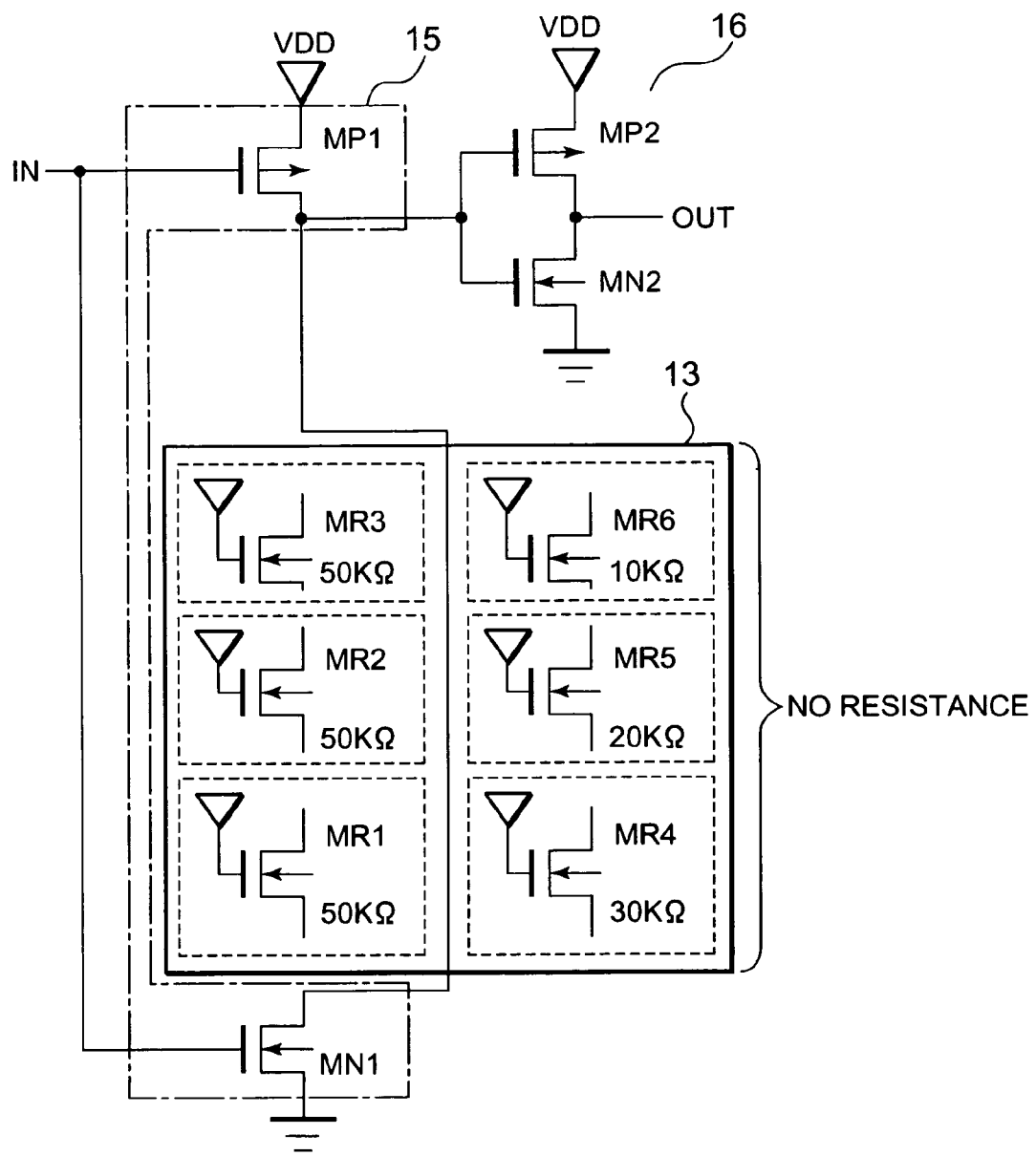
FIG. 3 is a circuit diagram in the first example of the layout of the semiconductor integrated circuit device in the first exemplary embodiment of the present invention.

FIG. 3 shows a circuit diagram of the circuit configuration of the semiconductor integrated circuit device in the above layout, which is the same as that shown in FIG. 1. This means that the NMOS transistor resistances in the transistor resistance area 13 are not connected to any other items (no-resistance).

Figure 4:
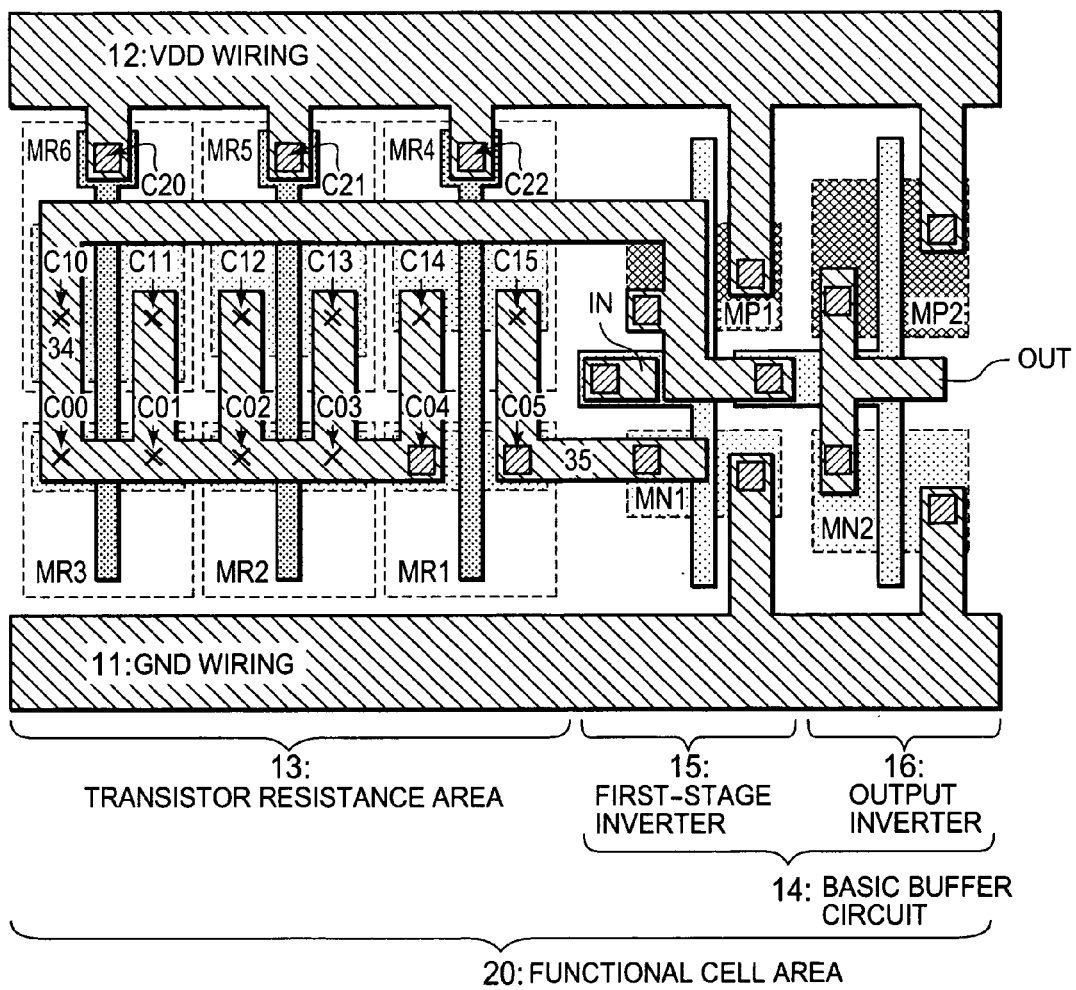
FIG. 4 is a second example of the layout of the semiconductor integrated circuit device in the first exemplary embodiment of the present invention.

FIG. 4 shows a second example of the layout of the semiconductor integrated circuit device in the first exemplary embodiment of the present invention. In FIG. 4, a wiring 34 is laid to the setting positions of contacts C00 to C03 and C10 to C14. And the wiring 34 is connected to the drain of the PMOS transistor MP1, the gates of the NMOS transistor MN2 and the PMOS transistor MP2, as well as the other end of the NMOS transistor resistance MR1 through a contact C04 respectively. A wiring 35 is laid to the setting position of a contact C15 and connected to the drain of the NMOS transistor MN1, as well as one end of the NMOS transistor resistance MR1 through a contact C05 respectively.

The wiring 34 is disconnected from part of the wiring 31 shown in FIG. 2, which is equivalent to the wiring 35 and connected to the wirings 32 and 33 shown in FIG. 2. In this case, the wirings 32 and 33 are laid at the minimum wiring interval, so the shape of the metal wiring masking pattern is not changed so much from that shown in FIG. 2. This means that the structure of the masking pattern of the present invention can be regarded as an equivalent to that of a masking pattern that includes no metal wiring change. The structure can thus eliminate the delay differences at the rising and falling edges to adjust the signal waveform duty ratio without taking any consideration to the influences by other chip wirings that might be made by an automatic wiring tool.

Figure 5:
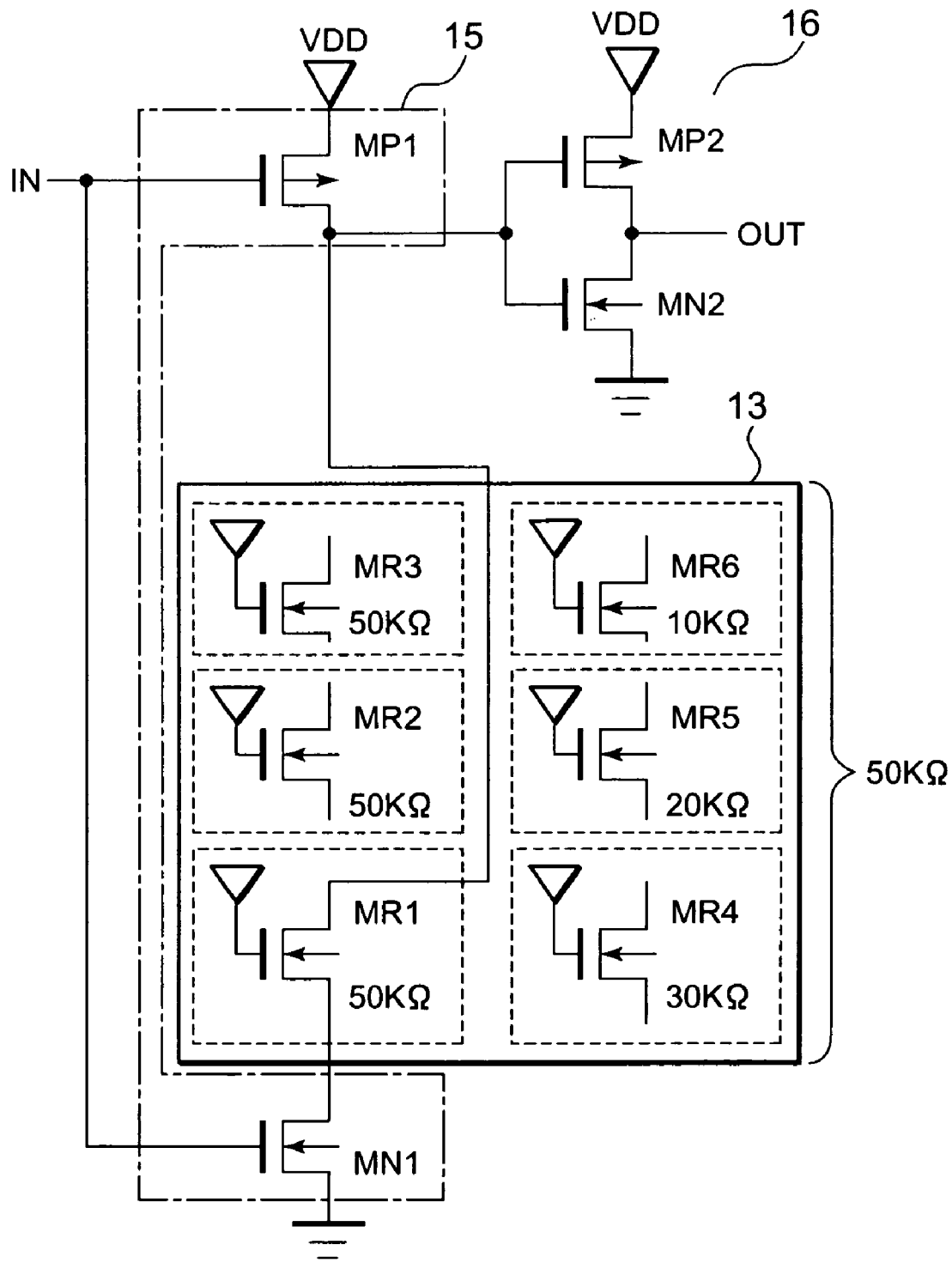
FIG. 5 is a circuit diagram in the second example of the layout of the semiconductor integrated circuit device in the first exemplary embodiment of the present invention.

FIG. 5 shows a circuit diagram of the circuit configuration in the above layout. In other words, the NMOS transistor resistance MR1 (resistance value 50KΩ) is connected between the drains of the NMOS transistor MN1 and the PMOS transistor MP1.

Figure 6:
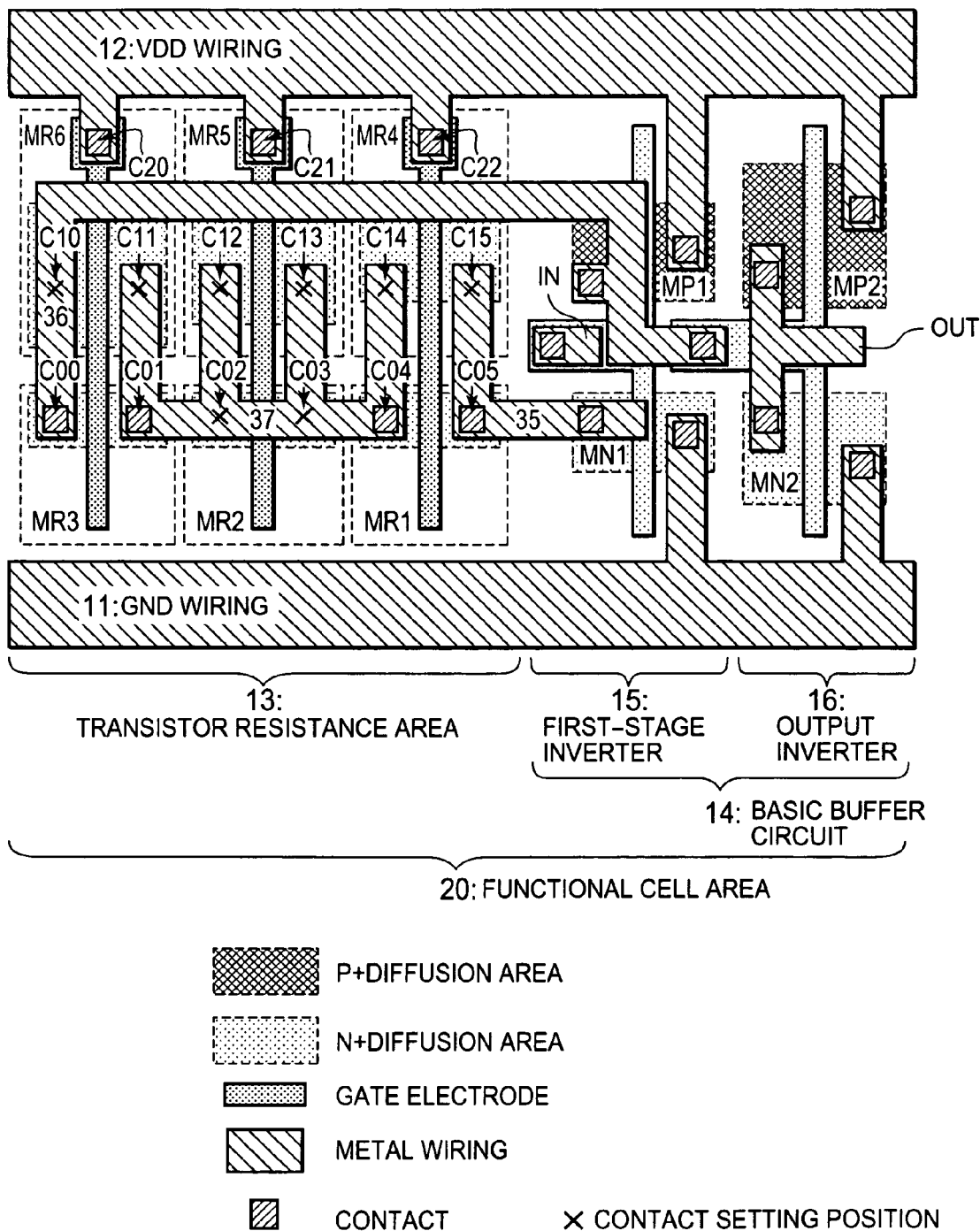
FIG. 6 is a third example of the layout of the semiconductor integrated circuit device in the first exemplary embodiment of the present invention.

FIG. 6 shows a third example of the layout of the semiconductor integrated circuit device in the first exemplary embodiment of the present invention. In FIG. 6, a wiring 36 is laid to the setting position of a contact C10 and connected to the drain of the PMOS transistor MP1, the gates of the NMOS transistor MN2 and the PMOS transistor MP2, as well as one end of the NMOS transistor resistance MR3 through the contact C00 respectively. A wiring 37 is laid to the setting positions of contacts C11 to C14, C02, and C03 and connected to the other end of the NMOS transistor resistance MR3 through a contact C01, and the other end of the NMOS transistor resistance MR1 through a contact C04. The wiring 35 is the same as that shown in FIG. 4.

Figure 7:
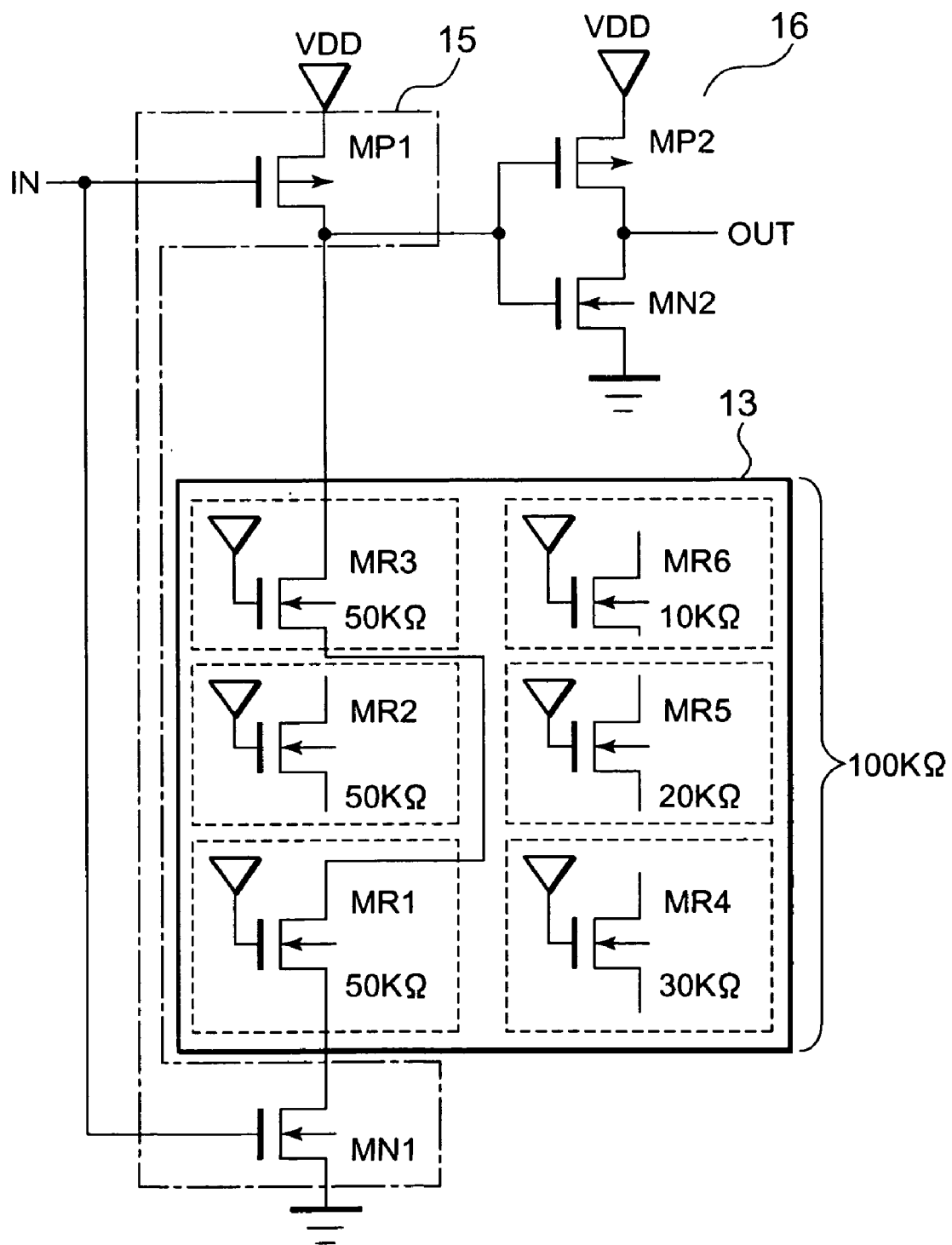
FIG. 7 is a circuit diagram in the third example of the layout of the semiconductor integrated circuit device in the first exemplary embodiment of the present invention.

FIG. 7 shows a circuit diagram of the circuit configuration in the above layout. This means that the NMOS transistor resistances MR1 and MR3 (resistance value 100KΩ) are connected to each other serially are connected between the drains of the NMOS transistor MN1 and the PMOS transistor MP1.

Figure 8:
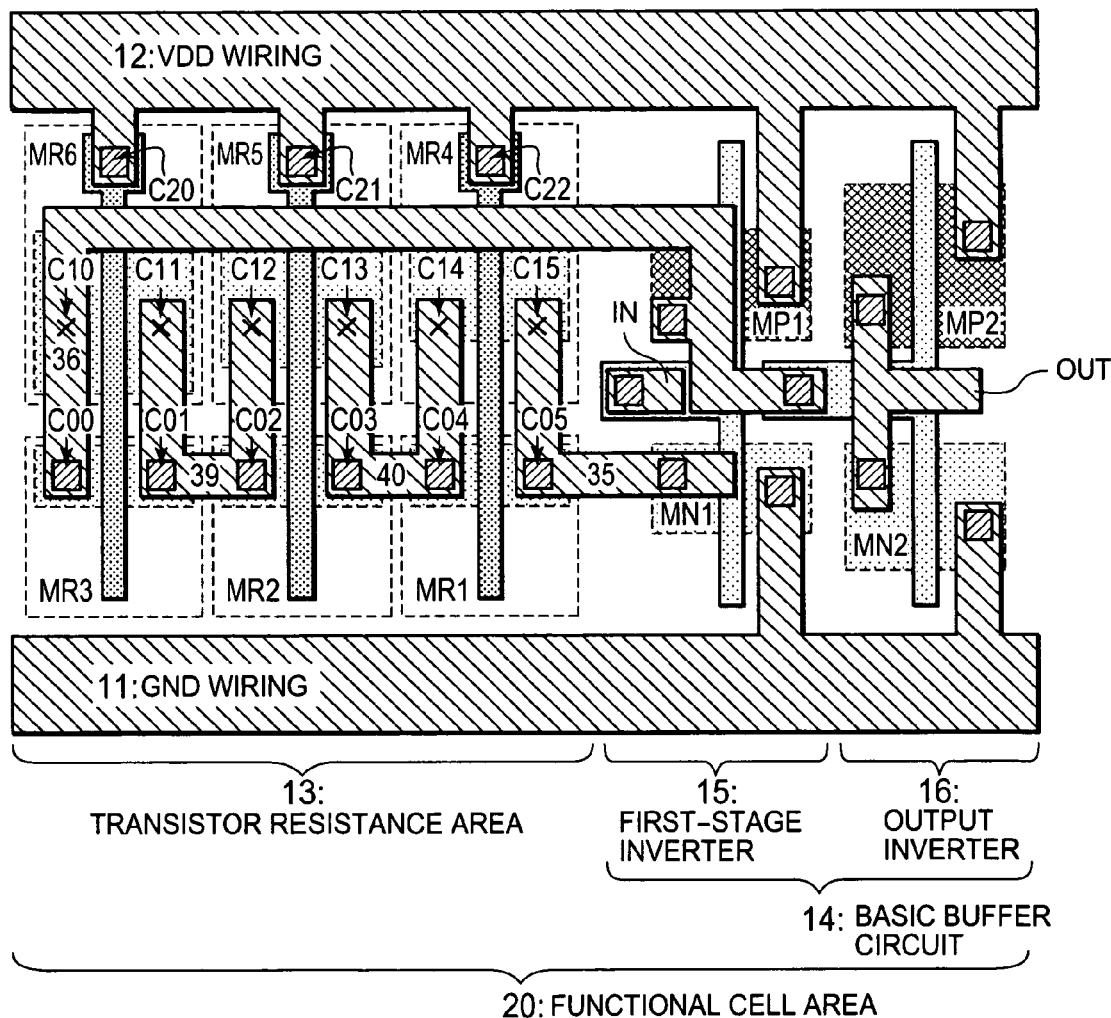
FIG. 8 is a fourth example of the layout of the semiconductor integrated circuit device in the first exemplary embodiment of the present invention.
Figure 8:
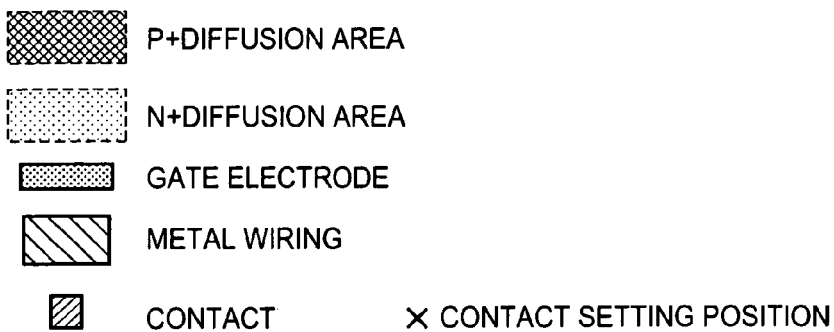

FIG. 8 shows a fourth example of the layout of the semiconductor integrated circuit device in the first exemplary embodiment of the present invention. In FIG. 8, wirings 35 and 36 are the same as those in FIG. 6. A wiring 39 is laid to the setting positions of contacts C11 and C12, connected to the other end of the NMOS transistor resistance MR3 through a contact C01, and one end of the NMOS transistor resistance MR2 through a contact C02 respectively. A wiring 40 is laid to the setting positions of contacts C13 and C14 and connected to the other end of the NMOS transistor resistance MR2 through a contact C03, and the other end of the NMOS transistor resistance MR1 through a contact C04 respectively.

Figure 9:
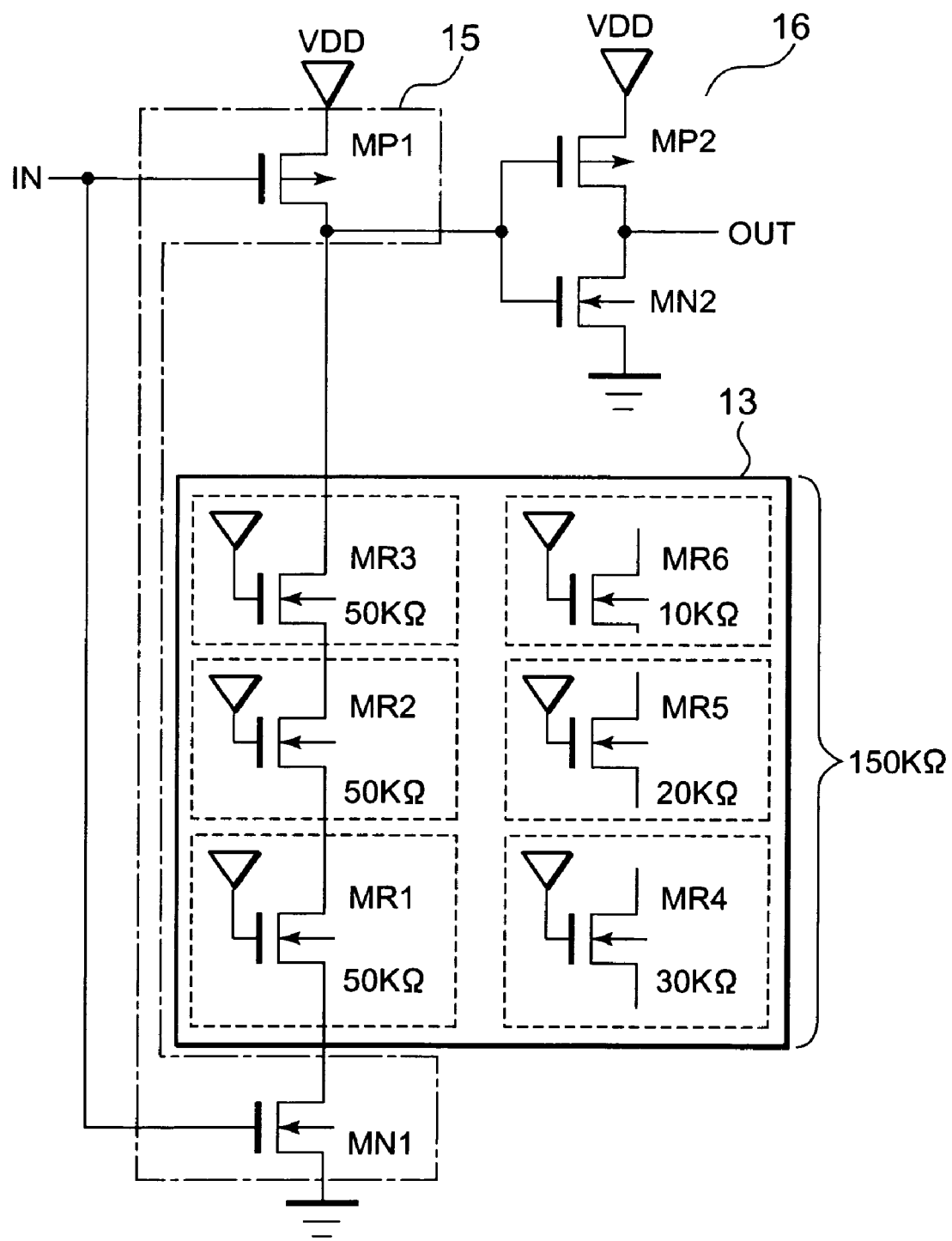
FIG. 9 is a circuit diagram in the fourth example of the layout of the semiconductor integrated circuit device in the first exemplary embodiment of the present invention.

FIG. 9 shows a circuit diagram of the circuit configuration in the above layout. This means that the NMOS transistor resistances MR1, MR2, and MR3 (resistance value 150KΩ) that are connected to each another serially are connected between the drains of the NMOS transistor MN1 and the PMOS transistor MP1.

Figure 10:
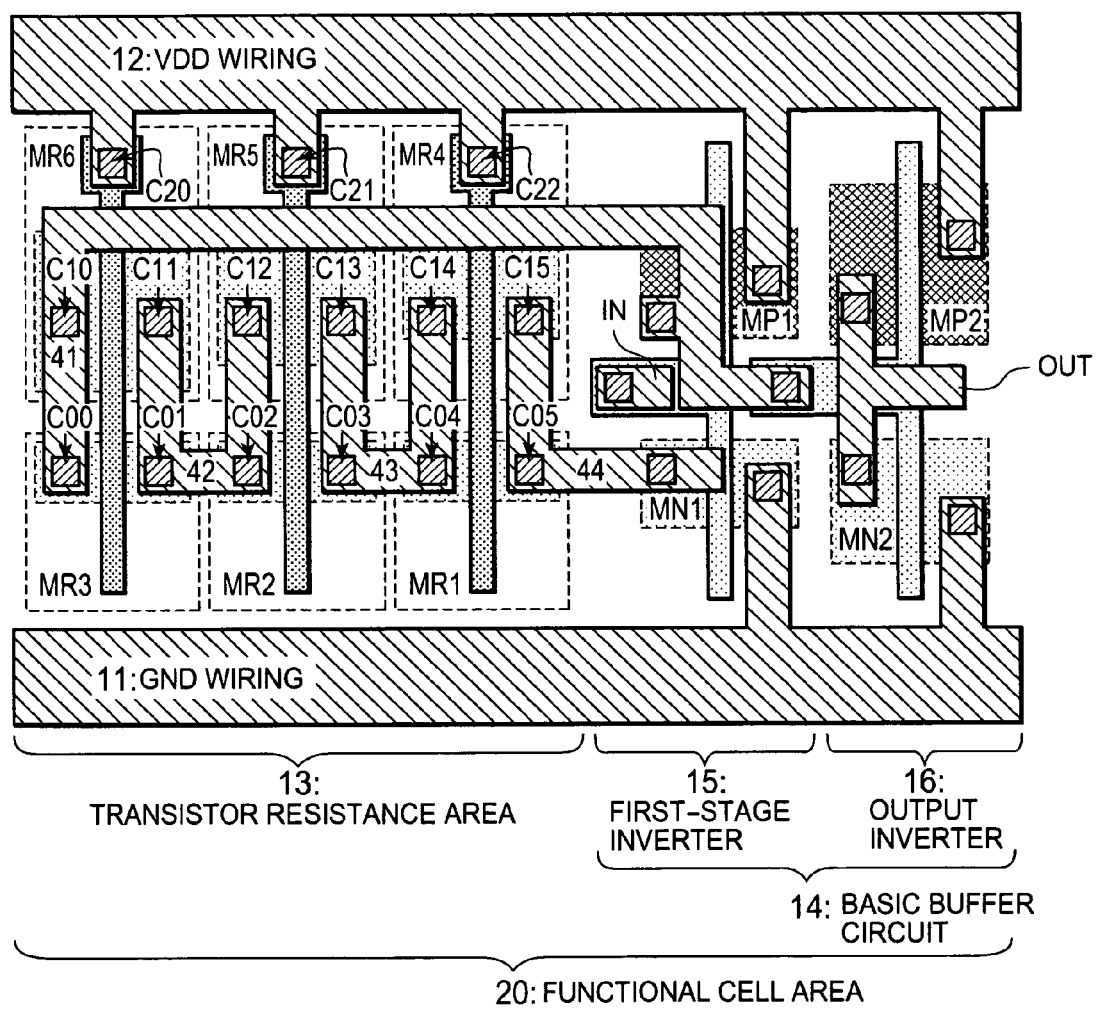
FIG. 10 is a fifth example of the layout of the semiconductor integrated circuit device in the first exemplary embodiment of the present invention.

FIG. 10 shows a fifth example of the layout of the semiconductor integrated circuit device in the first exemplary embodiment of the present invention. In FIG. 10, a wiring 41 is connected to one end of the NMOS transistor resistance MR3 through a contact C00, one end of the NMOS transistor resistance MR6 through a contact C10, the drain of the PMOS transistor MP1, and the gates of the NMOS transistor MN2 and the PMOS transistor MP2 respectively. A wiring 42 is connected to the other end of the NMOS transistor resistance MR3 through a contact C01, the other end of the NMOS transistor resistance MR6 through a contact C11, one end of the NMOS transistor MR2 through a contact C02, and one end of the NMOS transistor resistance MR5 through a contact C12. The wiring 43 is connected to the other end of the NMOS transistor resistance MR2 through a contact C03, and the other end of the NMOS transistor resistance MR5 through a contact C13, the other end of the NMOS transistor resistance MR1 through a contact C04, and the other end of the NMOS transistor resistance MR4 through a contact C14. A wiring 44 is connected to the drain of the NMOS transistor MN1, one end of the NMOS transistor resistance MR1 through a contact C05, and one end of the NMOS transistor resistance MR4 through a contact C15.

Figure 11:
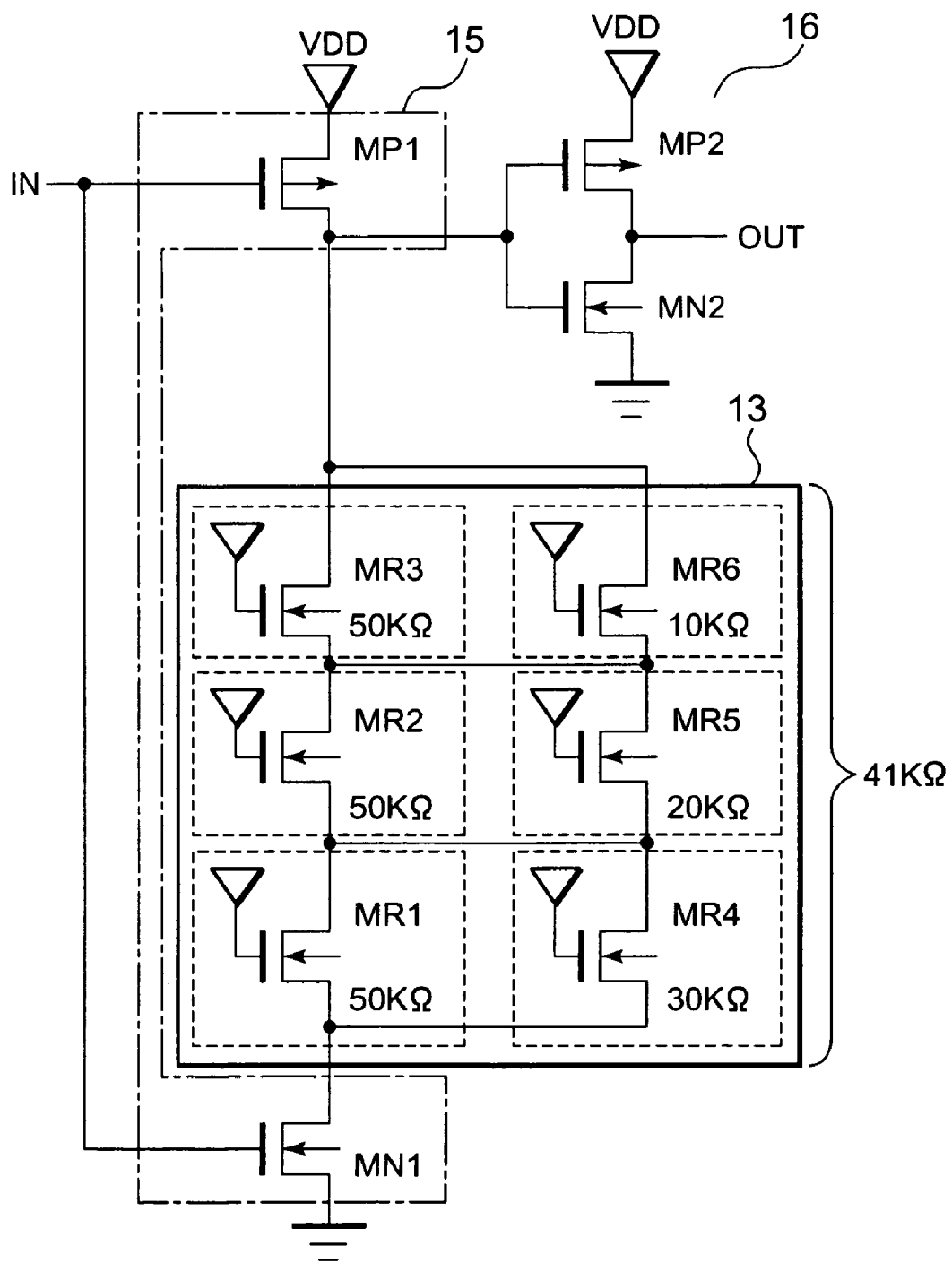
FIG. 11 is a circuit diagram in the fifth example of the layout of the semiconductor integrated circuit device in the first exemplary embodiment of the present invention.

FIG. 11 shows a circuit diagram of the circuit configuration in the above layout. This means that the NMOS transistor resistances MR1 and MR4 that are connected to each other in parallel, the NMOS transistor resistances MR2 and MR5 that are connected to each other in parallel, and the NMOS transistor resistances MR3 and MR6 that are connected to each other in parallel are connected to each another serially (resistance value 41KΩ) between the drains of the NMOS transistor MN1 and the PMOS transistor MP1.

Figure 12:
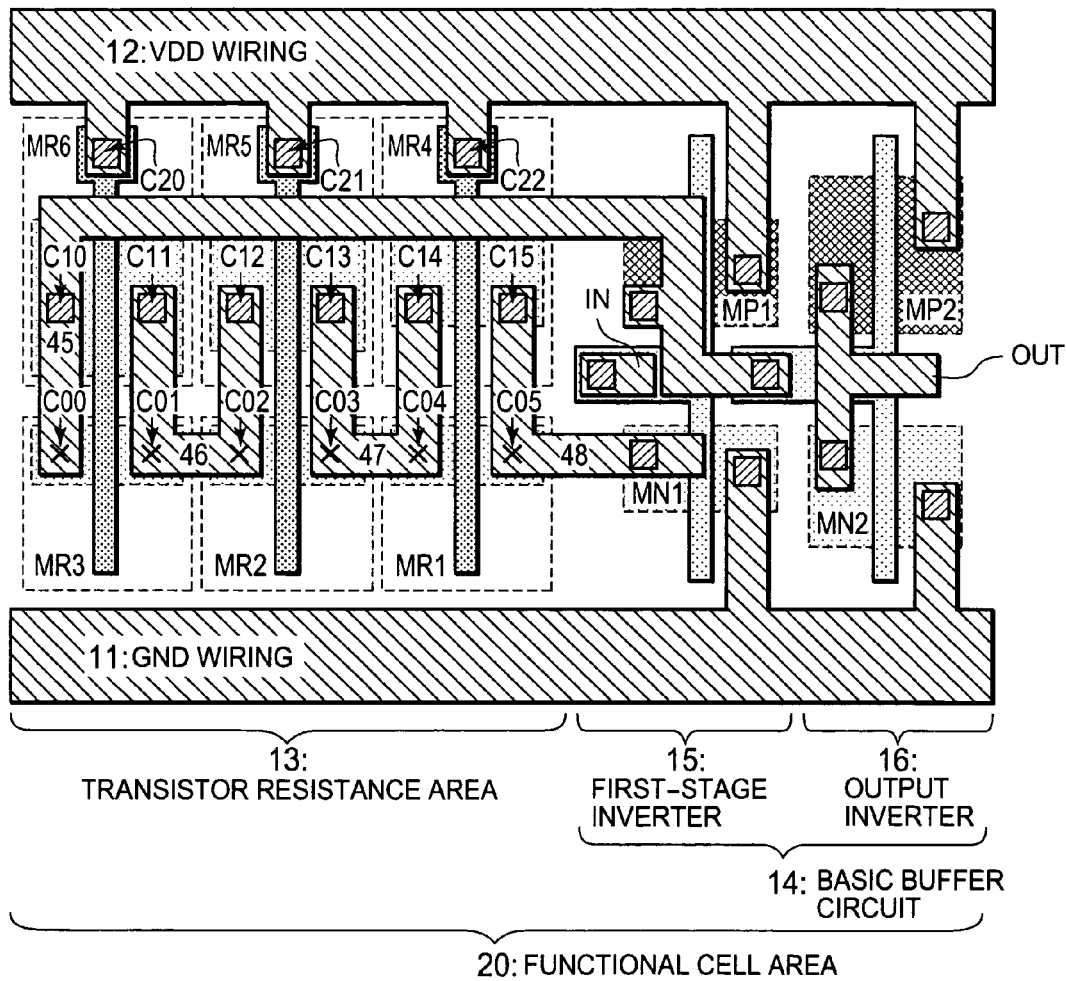
FIG. 12 is a sixth example of the layout of the semiconductor integrated circuit device in the first exemplary embodiment of the present invention.
Figure 12:
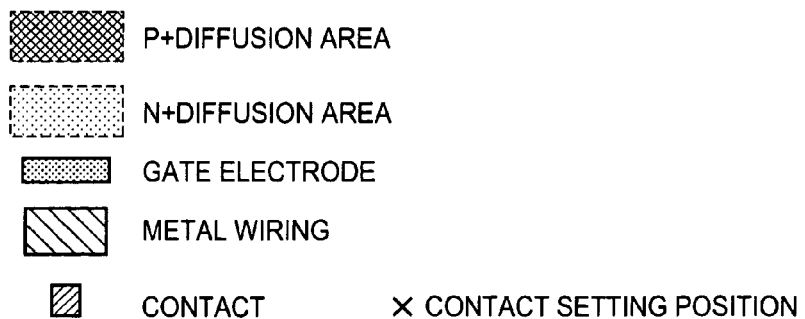

FIG. 12 shows a sixth example of the layout of the semiconductor integrated circuit device in the first exemplary embodiment of the present invention. In FIG. 12, a wiring 45 is laid to the setting position of a contact C00, connected to one end of the NMOS transistor resistance MR6 through a contact C10, the drain of the PMOS transistor MP1, and the gates of the NMOS transistor MN2 and the PMOS transistor MP2 respectively. A wiring 46 is laid to the setting positions of contacts C01 and C02 and connected to the other end of the NMOS transistor resistance MR6 through a contact C11 and one end of the NMOS transistor resistance MR5 through a contact C12 respectively. A wiring 47 is laid to the setting positions of contacts C03 and C04 and connected to the other end of the NMOS transistor resistance MR5 through a contact C13 and the other end of the NMOS transistor resistance MR4 through a contact C14. A wiring 48 is connected to the drain of the NMOS transistor MN1, laid to the setting position of the contact C05, and connected to one end of the NMOS transistor resistance MR4 through a contact C15 respectively.

Figure 13:
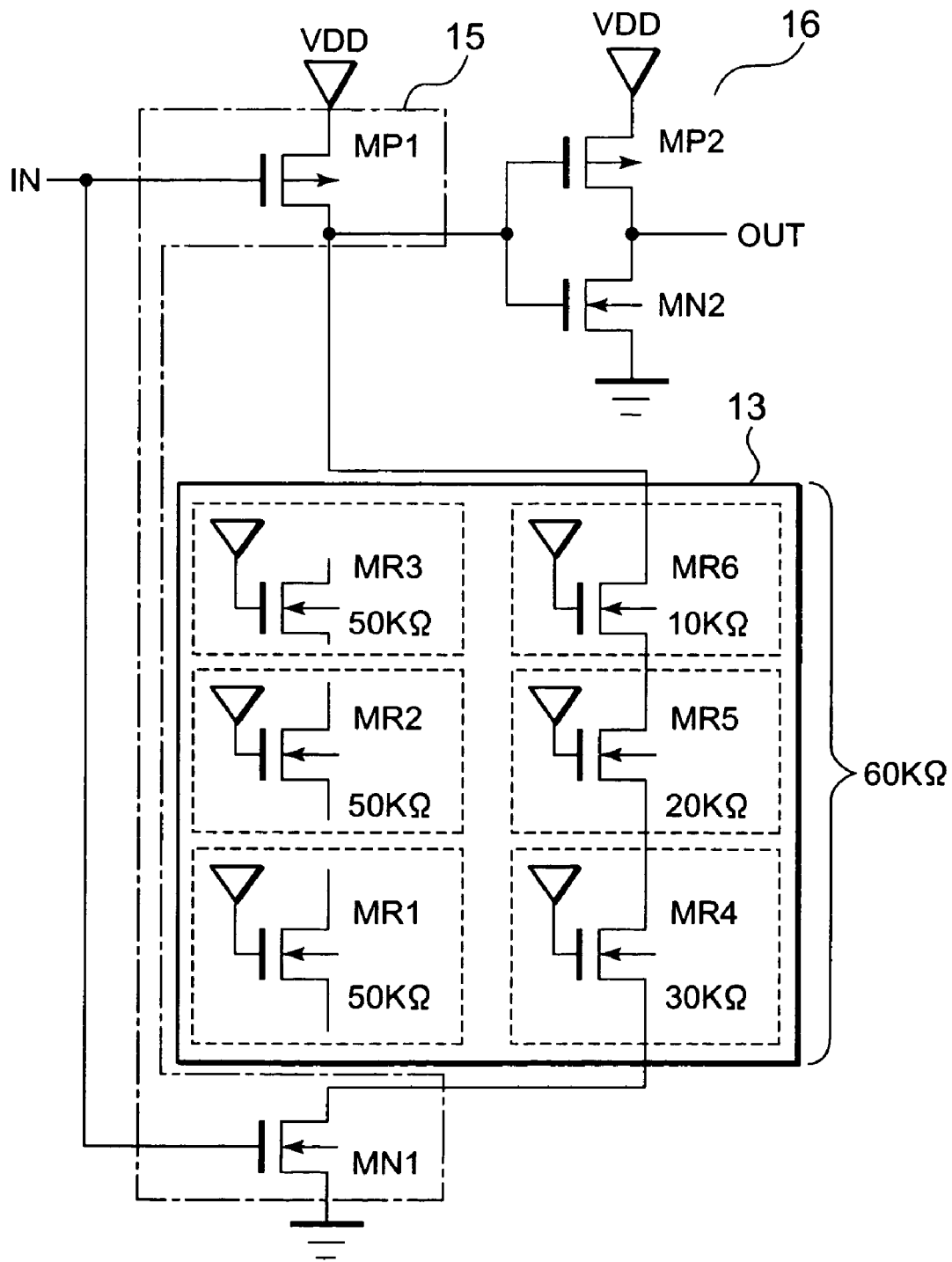
FIG. 13 is a circuit diagram in the sixth example of the layout of the semiconductor integrated circuit device in the first exemplary embodiment of the present invention.

FIG. 13 shows a circuit diagram of the circuit configuration in the above layout. This means that the NMOS transistor resistances MR4 to MR6 that are connected to each another serially (resistance value 60KΩ) between the drains of the NMOS transistor MN1 and the PMOS transistor MP1.

Figure 14:
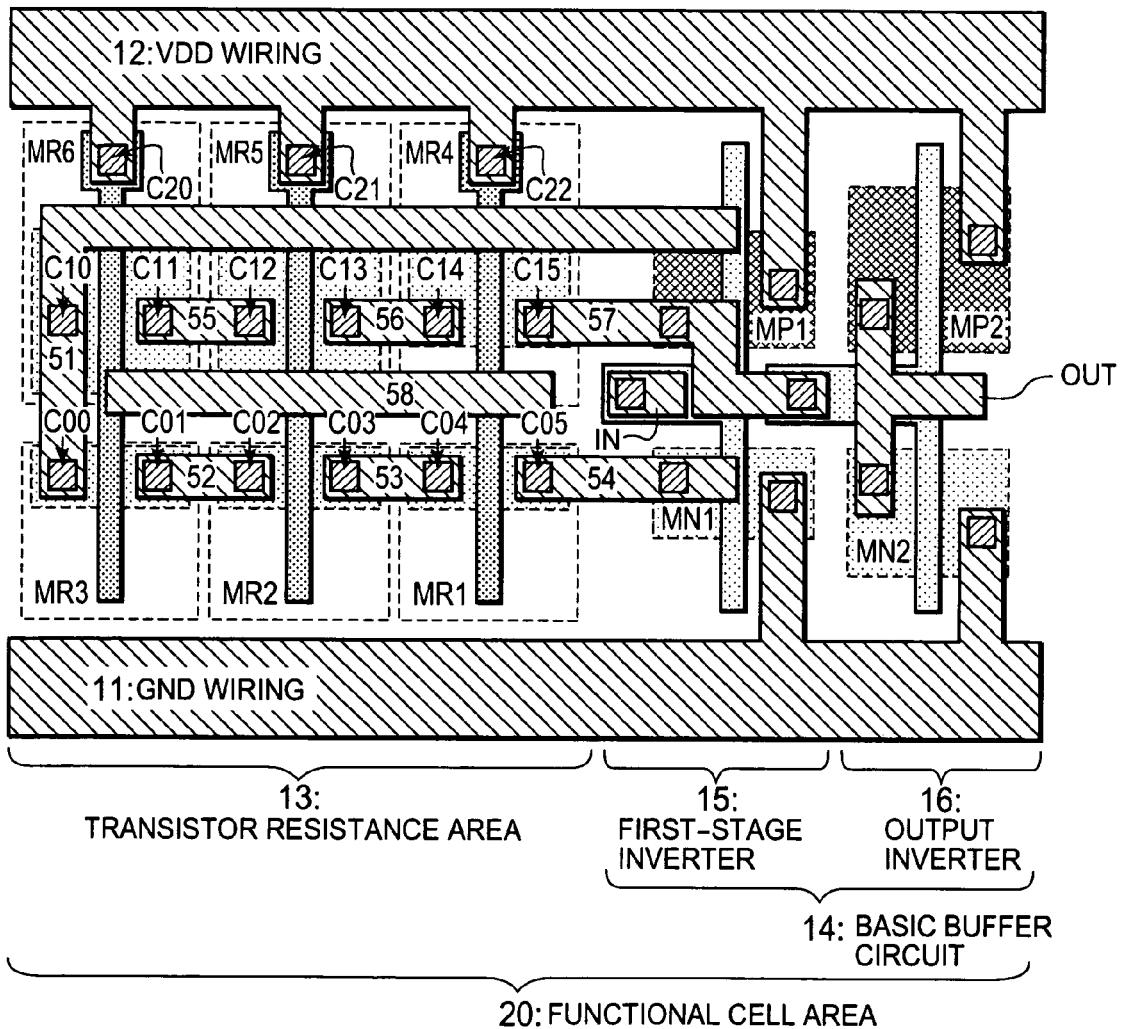
FIG. 14 is a seventh example of the layout of the semiconductor integrated circuit device in the first exemplary embodiment of the present invention.

FIG. 14 shows a seventh example of the layout of the semiconductor integrated circuit device in the first exemplary embodiment of the present invention. In FIG. 14, a wiring 51 is connected to one end of the NMOS transistor resistance MR3 through a contact C00 and one end of the NMOS transistor resistance MR6 through a contact C10. A wiring 52 is connected to the other end of the NMOS transistor resistance MR3 through a contact C01 and one end of the NMOS transistor resistance MR2 through a contact C02. A wiring 53 is connected to the other of the NMOS transistor resistance MR 2 through a contact C03 and the other end of the NMOS transistor resistance MR 1 through a contact C04. A wiring 54 is connected to the one end of the NMOS transistor resistance MR 1 through a contact C05 and to the drain of the NMOS transistor MN1. A wiring 55 is connected to the other end of the MOS transistor resistance MR 6 through a contact C11 and one end of the NMOS transistor resistance MR 5 through a contact C12. A wiring 56 is connected to the other end of the NMOS transistor resistance MR 5 through a contact C13 and the other end of the NMOS transistor resistance MR 4 through a contact C14. A wiring 57 is connected to one end of the NMOS transistor resistance MR 4 through a contact C15, the drain of the PMOS transistor MP 1, and the gates of the NMOS transistor MN2 and the PMOS transistor MP2 respectively.

Figure 15:
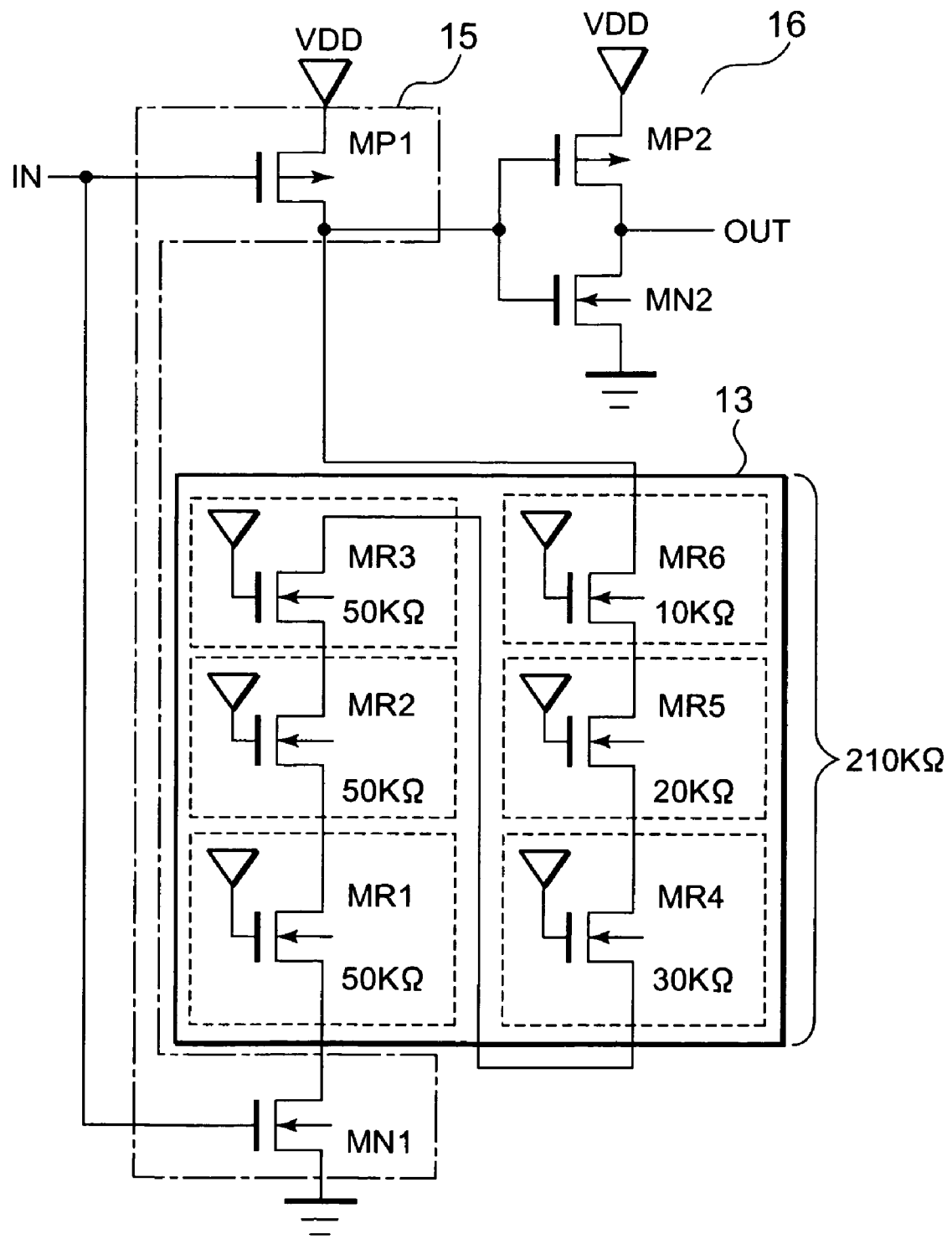
FIG. 15 is a circuit diagram in the seventh example of the layout of the semiconductor integrated circuit device in the first exemplary embodiment of the present invention.

FIG. 15 shows a circuit diagram of the circuit configuration in the above layout. This means that the NMOS transistor resistances MR 1 to MR6 are connected to each another serially (resistance value 210KΩ) between the drains of the NMOS transistor MN1 and the PMOS transistor MP1.

In FIG. 14, the wiring 58 is a dummy wiring laid between a pair of the wirings 52 and 53 and a pair of the wirings 55 and 56 at the minimum wiring interval so as to prevent other chip wirings from being laid there by an automatic wiring tool. The wiring 58 is not connected to any item. A wiring 51 is also laid between the wirings 55 and 56 and among the contacts C20, C21, and C22 so as to be extended up to the upper portion of the PMOS transistor MP 1 and to prevent other chip wirings from being laid therebetween.

In addition to the layouts described above, it is also possible to configure a variety of composite resistors by changing metal wiring patterns and by changing combinations of transistor resistances according to whether or not there is any contacts in the subject layout.

While there has been described the basic buffer circuit 14 consisting of inverter circuits disposed in two stages, the circuit 14 may not be limited only to that one 14; the same method can also apply to any other functional cells. Furthermore, while a larger output delay is required at the rising edge in the above case, the same method can also apply to a case in which a larger output delay is required at the falling edge.

As described above, the semiconductor integrated circuit device in this first exemplary embodiment of the present invention can obtain a necessary waveform duty ratio by changing the connection among the object transistor resistances; there is no need to change the size of the cells. In this case, it is just required to prepare a plurality of transistor resistances and connect a desired transistor resistance to the drain of the object NMOS transistor MN1 to configure cells having various duty ratios corresponding to various delay paths respectively; there is no need to design each cell differently from others. The cells having different duty ratios corresponding to various delay paths in such a way, which are the same in size and in metal wiring interval, are all equivalent in metal structure, so there is no need to design any layout newly even for those cells that are to be replaced with others.

Furthermore, in case of the semiconductor integrated circuit device in this first exemplary embodiment of the present invention, in the transistor resistance area 13, there will not be generated any of diffusion layers and unevenly disposed gates; the area 13 can function as a favorable mask pattern from a viewpoint of the DFM (Design For Manufacturing) and the area 13 will make it possible to expect the library accuracy improvement and secure the desired accuracy for timing adjustment. The DFM mentioned here includes the concepts of DFT (Design for Reliability) and DFD (Design for Diagnostic). In other words, the DFM represents a general concept of designing that takes consideration to the productivity of chip manufacturing. It is generally well known that if there are any diffusion layers or any gates that are disposed at an uneven interval, the quality of the transistors comes to be varied in the manufacturing process by lithography, thereby the manufacturing yield is lowered. The semiconductor integrated circuit device in this first exemplary embodiment of the present invention can prevent such troubles and configure cells with use of a mask pattern structured so as to assure disposition of transistors with less unevenness of intervals. This is why the present invention can configure cells favorably from the viewpoint of the DFM.

Second Exemplary Embodiment

Figure 16:
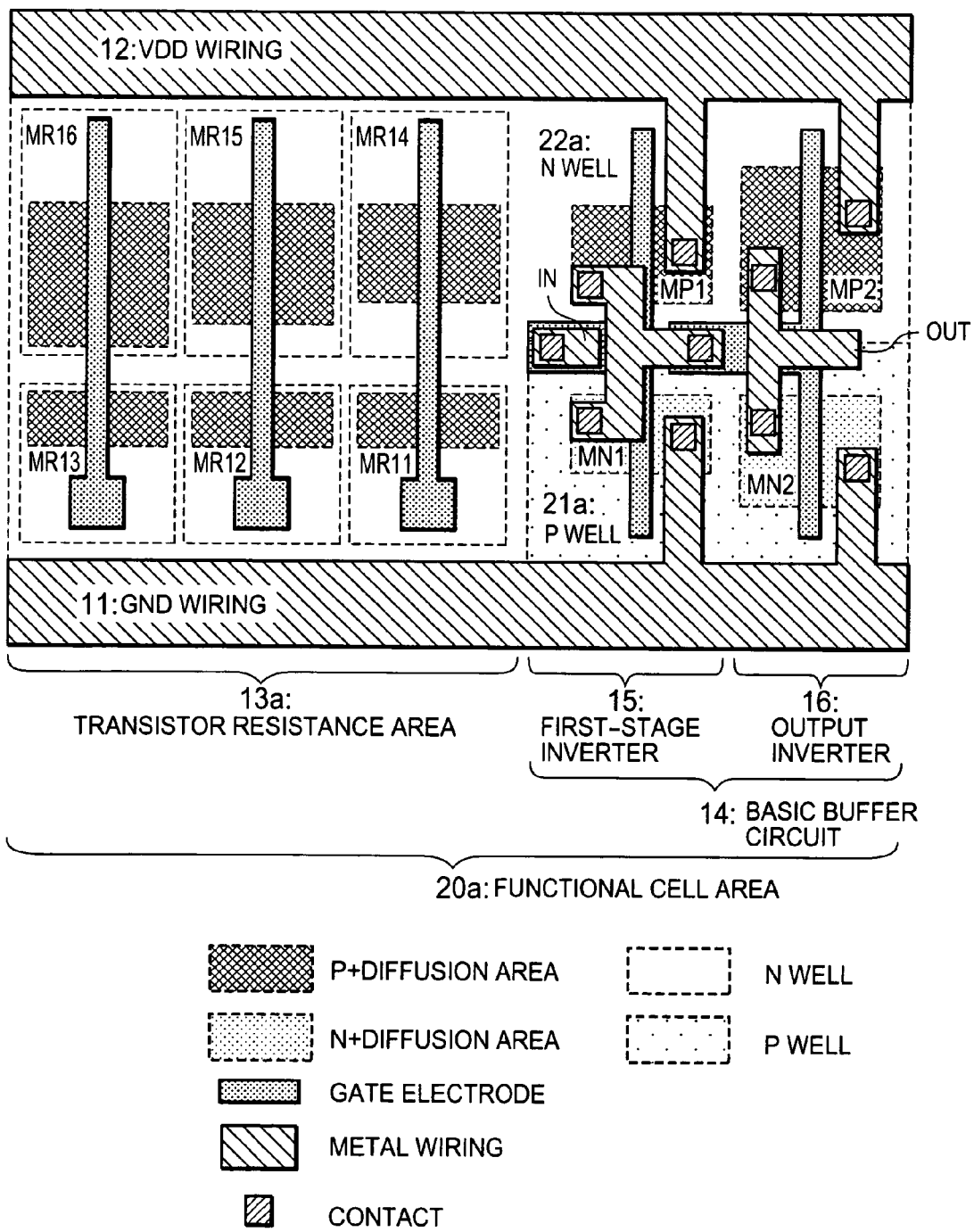
FIG. 16 is a basic layout of a semiconductor integrated circuit device in a second exemplary embodiment of the present invention.

FIG. 16 shows a basic layout of a semiconductor integrated circuit device in this second exemplary embodiment of the present invention. In FIG. 16, the same reference numerals will be used for the same components as those shown in FIG. 1, avoiding redundant description. In FIG. 16, the semiconductor integrated circuit device includes a rectangular functional cell area 20a provided between a GND wiring 11 and a VDD wiring 12 laid in parallel to the GND wiring 11. The functional cell area 20a includes a transistor resistance area 13a and a basic buffer circuit 14 that are adjacent to each other.

The transistor resistance area 13a includes approximately rectangular N well having two sides that are part of the GND wiring 11 and part of the VDD wiring 12, as well as PMOS transistor resistances MR11 to MR16 provided in this N well. In FIG. 16, a region equivalent to the N well 22 shown in FIG. 1 and the N well in the transistor resistance area 13a are integrated into one (as an N well 22a). The PMOS transistor resistances MR11 to MR16 mean resistors generated by transistors in the P+ diffusion region in the transistor disposition area. It is premised here that the PMOS transistor resistances MR11 to MR16 have gate widths W1, W1, W1, W2, W3, and W4 and resistance values 50KΩ, 50KΩ, 50KΩ, 30KΩ, 20KΩ, and 10KΩ respectively. The gates of the PMOS transistor resistances MR11 and MR14, the gates of the PMOS transistor resistances MR12 and MR15, and the gates of the PMOS transistor resistances MR13 and MR16 are connected in common to each other respectively. The PMOS transistor resistances MR11 to MR16 have no connection paths except for their gates.

Next, there will be described a configuration example to be employed for a case in witch a contact and/or wiring mask option is used to connect the PMOS transistor resistances MR11 and MR16 to each another to make delay adjustments. In the following example, the transistor structure (ground) is kept is as in the transistor resistance area 13a while a contact and/or wiring mask option is used to change the connection among the transistor resistances. Furthermore, the wiring for the drains of the NMOS transistor MN1 and the PMOS transistor MP1 is changed as needed. In the following layout, the same reference numerals will be used for the same elements as those in FIG. 16, avoiding redundant description.

Figure 17:
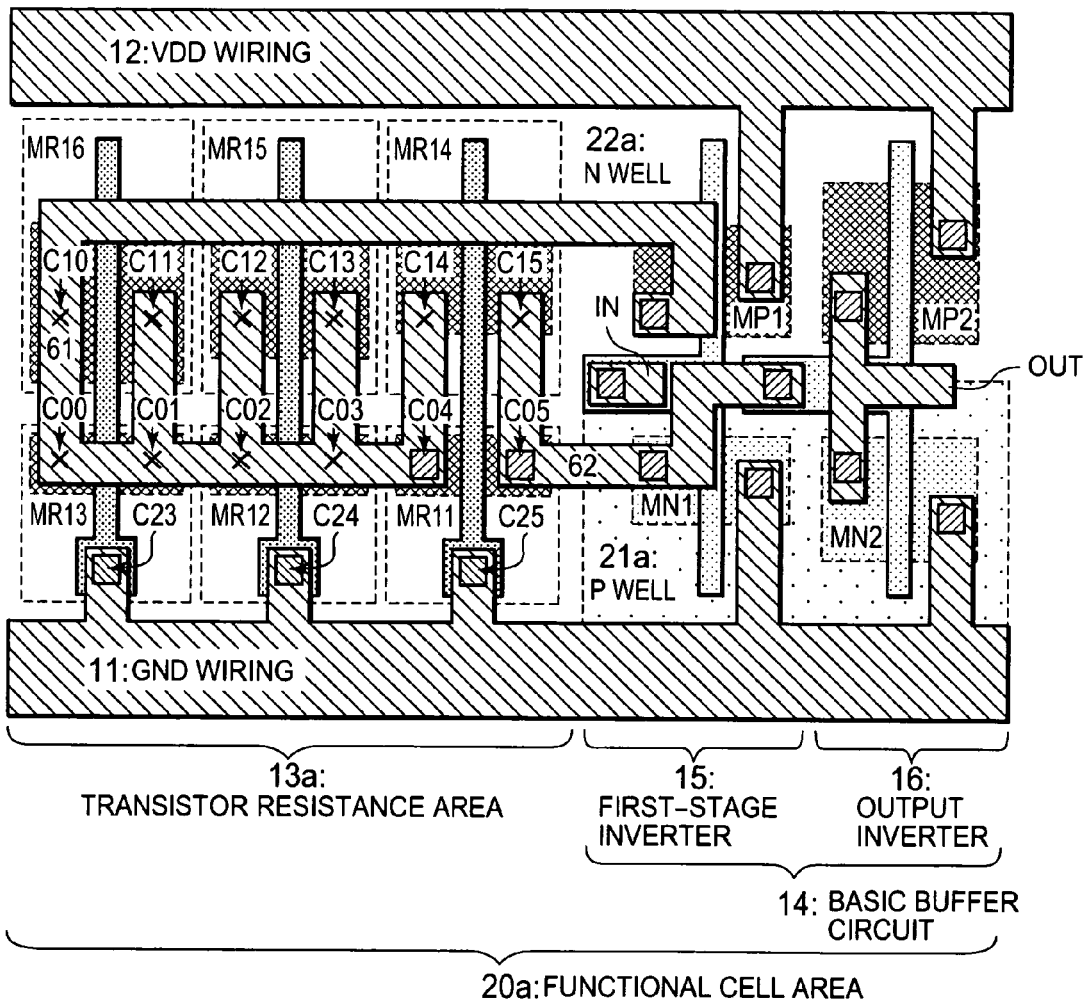
FIG. 17 is a layout example of the semiconductor integrated circuit device in the second exemplary embodiment of the present invention.
Figure 17:
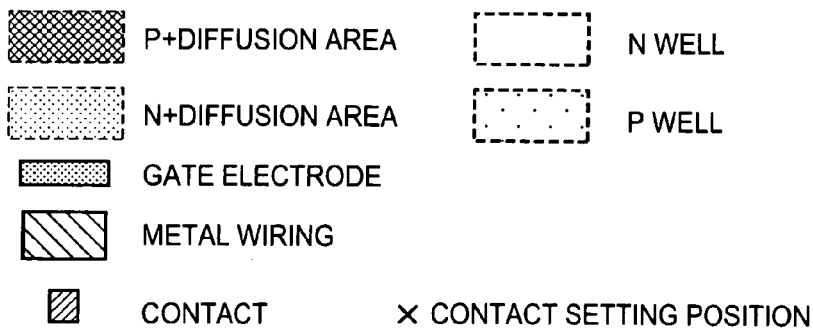

FIG. 17 shows a layout example of a semiconductor integrated circuit device in this second exemplary embodiment of the present invention. In FIG. 17, the gates of the PMOS transistor resistances MR11 and MR14 are connected to the GND wiring 11 through a contact C25. The gates of the PMOS transistor resistances MR12 and MR15 are connected to the GND wiring 11 through a contact C24. And the gates of the PMOS transistor resistances MR13 and MR16 are connected to the GND wiring 11 through a contact C23.

A wiring 61 is laid to the setting positions of contacts C00 to C03, as well as to the setting positions of contacts C10 to C14. A wiring 61 is connected to the drain of the PMOS transistor MP1, as well as to the other end of the PMOS transistor resistance MR 11 through a contact C04. The wiring 62 is laid to the setting position of a contact C15 and connected to the drain of the NMOS transistor MN1, the gate of the PMOS transistor MP2, the NMOS transistor MN2 as well as to one end of the PMOS transistor resistance MR11 through a contact C05.

Figure 18:
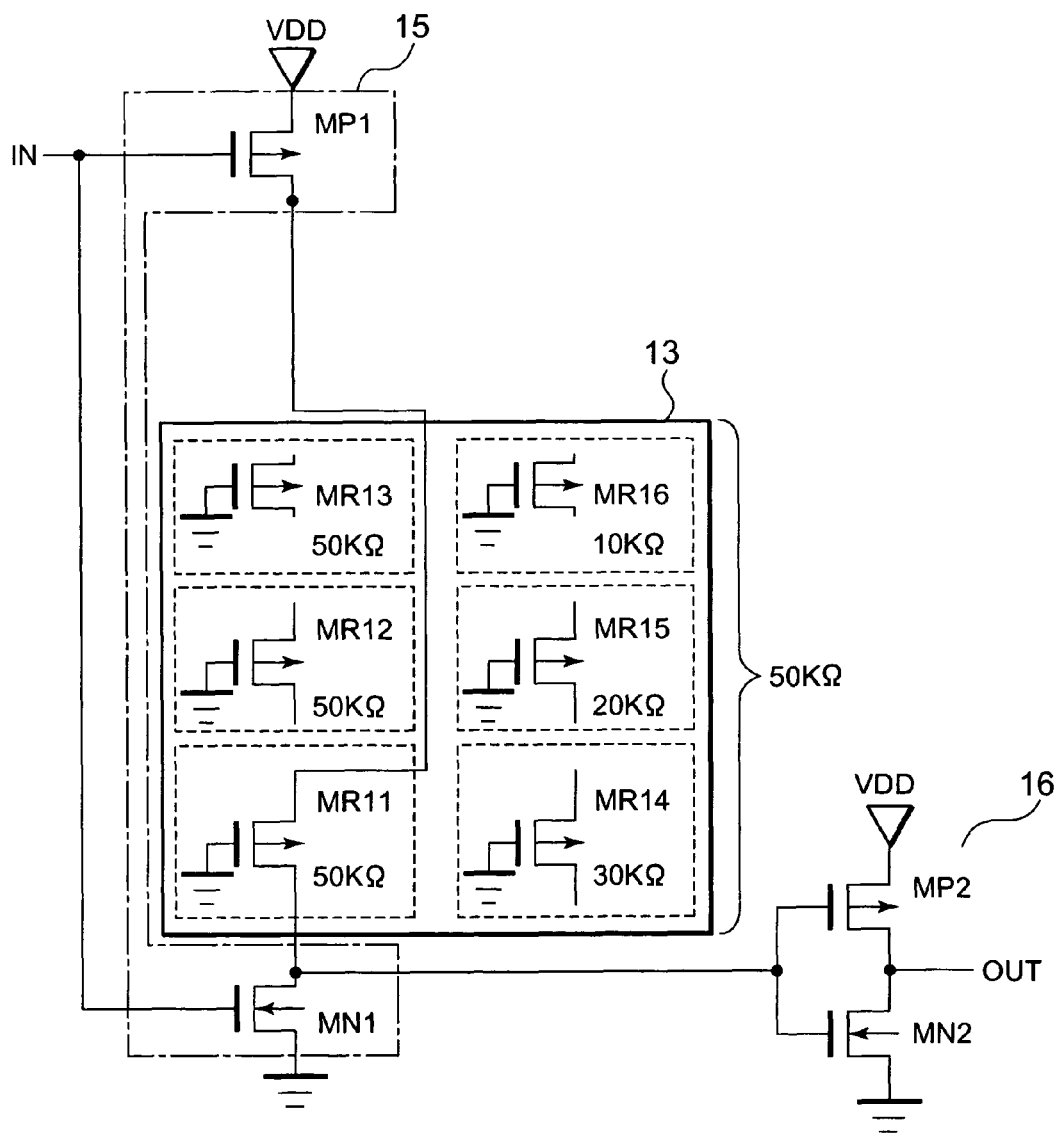
FIG. 18 is another layout example of the semiconductor integrated circuit device in the second exemplary embodiment of the present invention.

FIG. 18 shows a circuit diagram of the circuit configuration in the above layout. This means that the PMOS transistor resistance MR11 (resistance value 50KΩ) is connected between the drains of the NMOS transistor MN1 and the PMOS transistor MP1.

In the semiconductor integrated circuit device in this second exemplary embodiment, the transistor resistances are formed with Pch transistors respectively. This is a different from the semiconductor integrated circuit device in the first exemplary embodiment. How to make resistance adjustments with use of those transistor resistances is the same as that in the first exemplary embodiment in which the transistor resistances are formed with Nch transistors respectively.

As described above, the disclosure of each of the patent documents is referred to as cited above in this specification. And it is to be understood that modifications including changes and adjustments will be apparent to those skilled in the art without departing from the spirit of the invention with respect to the whole disclosure of the present invention (including the claims), as well as the basic technical concepts of the present invention. Furthermore, various combinations of disclosed elements and selections from those elements are possible without departing the claims of the present invention.

Further, it is noted that Applicant's intent is to encompass equivalents of all claim elements, even if amended later during prosecution.

What is claimed is:

1. A semiconductor integrated circuit device, comprising:
a first power supply wiring which receives a first voltage supply;
a second power supply wiring, which receives a second voltage supply and is laid in parallel to the first power supply wiring;
a plurality of standard cells provided in a substantially rectangular area having two sides that are a part of the first power supply wiring and a part of the second power supply wiring; and
at least one transistor resistance area provided in the rectangular area, wherein each of the standard cells includes:
a first well of a first conductivity provided along the first power supply wiring;
a second well of a second conductivity provided along the second power supply wiring and between the first well and the second power supply wiring;
a first-conductivity MOS transistor provided in the second well; and
a second-conductivity MOS transistor provided in the first well, wherein the transistor resistance area includes:
a third well of the first or second conductivity, having a substantially rectangular shape including two sides that are a portion of the first power supply wiring and a portion of the second power supply wiring; and
a plurality of MOS transistor resistances each having a conductivity opposite to that of the third well, and
wherein the plurality of MOS transistor resistances are arranged so that a number of MOS transistor resistances among the plurality of MOS transistor resistances are connected to each other serially, in parallel, or in a combination of serial and parallel connections between the first-conductivity MOS transistor and the second-conductivity MOS transistor.

2. The semiconductor integrated circuit device according to claim 1, wherein a mask option for at least one of a contact and a wiring is used to connect the number of transistor resistances to each other.

3. The semiconductor integrated circuit device according to claim 1, wherein in each of the standard cells, a source of the second-conductivity MOS transistor is connected to the first power supply wiring, a source of the first-conductivity MOS transistor is connected to the second power supply wiring, gates of the first-conductivity MOS transistor and the second-conductivity MOS transistor are connected in common to each other to form an input end, and a drain of the first-conductivity MOS transistor or the second-conductivity MOS transistor is used as an output end.

4. The semiconductor integrated circuit device according to claim 1, wherein gates of the plurality of the first-conductivity MOS transistor resistances are connected to the first power supply wiring.

5. The semiconductor integrated circuit device according to claim 1, wherein gates of the plurality of the second conductivity MOS transistor resistances are connected to the second power supply wiring.

6. The semiconductor integrated circuit device according to claim 1, wherein the plurality of MOS transistors include several types of transistor resistances that are different from each other in transistor size.

7. The semiconductor integrated circuit device according to claim 4, wherein the plurality of MOS transistors include several types of transistor resistances that are different from each other in transistor size.

8. The semiconductor integrated circuit device according to claim 5, wherein the plurality of MOS transistors include several types of transistor resistances that are different from each other in transistor size.

9. The semiconductor integrated circuit device according to claim 1, wherein each of the standard cells and each of the transistor resistance areas are disposed adjacently, and wherein the first and third wells are common, or the second and third wells are common.

10. The semiconductor integrated circuit device according to claim 2, wherein a wiring area related to the mask option includes a wiring laid at an integer multiple of a minimum interval of the wiring rule, so that a dummy wiring can be laid in a blank region between the wirings related to the mask option.

* * * * *